(12) United States Patent
Serizawa

(10) Patent No.: US 6,212,210 B1
(45) Date of Patent: Apr. 3, 2001

(54) CONTROL METHOD AND APPARATUS FOR STABILIZING OPTICAL WAVELENGTH

(75) Inventor: Hideyuki Serizawa, Ueda (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/176,579

(22) Filed: Oct. 21, 1998

(30) Foreign Application Priority Data

Oct. 24, 1997 (JP) .................................................. 9-292228

(51) Int. Cl.[7] .............................. H01S 3/13; H01S 3/04; H01S 3/00; H01S 3/097
(52) U.S. Cl. ...................... 372/32; 372/29.02; 372/38.1; 372/34; 372/81
(58) Field of Search .................................. 372/29.02, 32, 372/38.1, 34, 81

(56) References Cited

U.S. PATENT DOCUMENTS 5,299,212 * 3/1994 Koch et al. ............................ 372/32
5,684,590 * 11/1997 Sanders et al. ...................... 356/350
6,018,536 * 1/2000 Alphonse ............................... 372/23

FOREIGN PATENT DOCUMENTS 186383 11/1982 (JP) .

2000151011 * 11/1998 (JP) .

OTHER PUBLICATIONS

Proceedings of the General Society of 1997 of the Institute of Electronics, Information, and Communication Engineers, B–10–215, p. 724.

\* cited by examiner

Primary Examiner—Frank G. Font
Assistant Examiner—Armando Rodriguez
(74) Attorney, Agent, or Firm—Sofer & Haroun, LLP

(57) ABSTRACT

A control apparatus for stabilizing optical wavelength output by a laser module in which a laser element, temperature sensor and cooling/heating element are installed, comprises a temperature deviation detecting circuit comprising a temperature monitor for detecting a laser temperature, and a first comparator for outputting a first control signal indicating a difference between the laser temperature and a control target value, a wavelength deviation detecting circuit comprising a wavelength monitor for detecting light output from the laser element, and a second comparator for outputting a second control signal indicating a difference between the wavelength of the detected output light and a control target value, a selector circuit for selecting either of the detecting circuits according to the external conditions of the laser element, and a current controller for controlling the current supplied to the cooling/heating element based on the output signal from the selected detecting circuit.

16 Claims, 5 Drawing Sheets

CONTROL METHOD AND APPARATUS FOR STABILIZING OPTICAL WAVELENGTH

BACKGROUND OF THE INVENTION

1. Field of the Invention

This invention relates to a control apparatus and method for stabilizing optical wavelength, and in particular a control apparatus and method for stabilizing optical wavelength which is suitable for use under any external conditions.

2. Description of the Related Art

In recent years, with the development of multimedia communications services, optical transmission systems which form the backbone of communications systems are moving to higher speeds and higher capacities, and optical wavelength division multiplexing is expected to make this high performance possible.

In this optical wavelength division multiplexing, several channels are transmitted on a common transmission path by assigning plural optical signals having different wavelengths as carriers to plural signals which are to be transmitted. Therefore, to avoid inter-channel interference in optical wavelength division multiplexing, interference between optical signals on adjacent wavelengths must be avoided, and optical wavelengths must consequently be stabilized with high precision.

Two factors that cause variation of the optical wavelength output by an optical transmitter are, for example, the temperature variations of laser elements and variation of laser diode driving current.

Conventionally, the optical wavelength output from the laser was stabilized by for example controlling the temperature of the laser element, or by monitoring the wavelength of the light output from the laser element so as to control the laser element temperature, as described hereafter.

First, referring to FIG. 1, a control mode will be described for stabilizing optical wavelength by maintaining the temperature of the laser element constant (referred to hereafter as "constant temperature control" mode).

An optical transmitter shown in FIG. 1 comprises a laser module 4A in which a laser diode LD is installed together with a temperature sensor 5 and a cooling/heating element 10, a temperature monitor 6 for monitoring a laser diode temperature using the temperature sensor 5, a target value setting circuit 8 for setting a target value of the laser diode temperature, a comparator 7 for comparing a value S6 of laser temperature monitored by the laser monitor 6 with a target value S8 set by the target value setting circuit 8, and a current controller 9 for controlling a current S9 supplied to the cooling/heating element 10 based on a comparison result S7 in the comparator 7.

In the optical transmitter, the difference between the laser temperature S6 monitored by the temperature sensor 5 and temperature monitor 6, and the target value S8 set by the setting circuit 8, is detected by the comparator 7, and sent to the current controller 9 as a deviation signal S7. In the current controller 9, an output current value is determined so that the detected difference becomes 0, and the cooling/heating element 10 is driven by the determined current value. Due to this temperature control, the temperature of the laser element (in this case, the laser diode) is kept constant, and the wavelength of light output from the laser element is stabilized. A control method identical to this is disclosed in Japanese Laid-open Patent Application No. 57-186383.

Next, referring to FIG. 2, a control mode will be described wherein the optical wavelength of light output from the laser is monitored to stabilize the optical wavelength (referred to hereafter as "wavelength monitoring control" mode).

The optical transmitter shown in FIG. 2 comprises a laser module 4B in which a laser diode LD is installed together with the temperature sensor 5 and cooling/heating element 10, optical coupler 11 for splitting part of the light output from the laser diode LD, optical wavelength monitor 12 for receiving the split light and monitoring its wavelength, target value setting circuit 13 for setting a target value of optical wavelength, comparator 14 for detecting a difference between a value S12 of optical wavelength monitored by the optical wavelength monitor and the target value of optical wavelength set by the target value setting circuit 13, and a current controller 9 for controlling the current S9 to be supplied to the cooling/heating element 10 based on a deviation signal S14 output by the comparator 14.

In the above optical transmitter, the wavelength of light output from the laser module 4 is monitored by the optical wavelength monitor 12, the difference between the monitored wavelength and the target value of wavelength set by the setting circuit 13 is detected by the comparator 14, and this difference is sent to the current controller 9. In the current controller 9, the current value is determined so that the detected difference becomes 0, and the cooling/heating element 10 is driven by the determined current value. An identical control method is described in Proceedings of the General Society of 1997 of the Institute of Electronics, Information and Communication Engineers, B-10-215, p. 724. In this control mode, as it is wavelength which is being monitored, wavelength variations due to laser element temperature variations or laser diode forward current variations can be suppressed.

In general, when a laser is operated for a long period, output power fluctuations occur due to deterioration over time. For this reason, the laser diode driving current is controlled to suppress output power fluctuations by an Auto Power Control (APC) circuit, but the laser optical wavelength also varies due to this change of laser diode driving current. Therefore, in the constant temperature control mode shown in FIG. 1, the optical wavelength of the laser varies as shown in FIG. 3 together with time shown on the horizontal axis.

As shown in FIG. 3, when the laser operating time is short, a driving current IF of the laser diode LD may be considered constant. Within these limits, the output current from the current controller 9 is controlled to a fixed target value even if the laser diode temperature S6 changes due to a variation of ambient temperature. Consequently, as the cooling/heating element 10 (FIG. 1) is driven by this output current, the wavelength of optical output is stabilized in the short-term.

However if the laser operating time is long, due to the laser's deterioration with time, the laser diode driving current IF(t) may vary due to the function of the APC circuit. In this case, a wavelength fluctuation amount $\Delta\lambda$ due to the laser diode driving current variation is given by the following equation (1).

$$\Delta\lambda = \alpha \cdot \{IF(tn) - IF(t0)\} \quad (1)$$

where $\alpha$=conversion constant between laser diode driving current and wavelength variation, IF(t0)=laser diode driving current value at initial time t0, IF(tn)=laser diode driving current value when time tn has elapsed.

This wavelength fluctuation amount $\Delta\lambda$ occurs regardless of laser diode temperature, so it cannot be corrected in this control method.

Also, when laser temperature is feedback controlled to a constant value, there is generally a considerable delay in the response (temperature variations) to manipulations (cooling or heating), and if the feedback gain is increased, the feedback loop may oscillate. Therefore, the feedback gain must be made small, but as the control error is directly proportional to the inverse of the feedback gain, the laser temperature cannot necessarily be maintained constant to a high precision. Consequently, in this control method, it is difficult to achieve highly precise stabilized control of optical wavelength.

On the other hand, in the wavelength monitoring control mode shown in FIG. 2 where the laser temperature is controlled by monitoring the optical wavelength of the light output from the laser, the optical wavelength can be stabilized even if the laser diode driving current varies. Therefore, even over a long period of time when the laser may deteriorate, the wavelength can be stabilized. Moreover, optical wavelength can be monitored rapidly and with high precision, so in this control mode, the wavelength can be stabilized with high precision.

However, in the wavelength monitoring control mode of FIG. 2, when the wavelength monitoring value is 0 or has become unstable, the current controller 9 recognizes a large difference between the optical wavelength of the laser output and the control target value, and supplies a current value to the cooling/heating element 10 to excessively heat or cool the laser element. This may cause damage or deterioration of the laser element.

Typical reasons why the wavelength monitoring value is zero or unstable are, for example, decrease of the split light led into the optical monitor 12, or instability of the optical wavelength output by the laser module 4. Therefore, for example, when a stop signal of the optical output is supplied or a loss of the optical signal occurs in the transmission path comprising the optical coupler 11 and wavelength monitor 12, or when an unstable wavelength state occurs immediately after the source voltage is switched on, the signal value output by the wavelength monitor 12 may be 0 or unstable, and temperature control may be performed leading to damage or deterioration of the laser element.

For example, when a stop signal SD is input as shown in FIG. 4, the driving current IF of the laser element LD stops, and the optical output from the laser decreases. In such a state, the output S12 of the optical wavelength monitor 12 is apparently zero wavelength, the value of the wavelength difference output from the comparator 14 is a maximum value, and the output current value from the current controller 9 is also a maximum value. As a result, the laser module 4 is excessively heated or cooled by the cooling/heating element 10, and there is a risk that this may lead to damage or deterioration of the laser element LD.

SUMMARY OF THE INVENTION

As described heretofore, in the constant temperature control mode, there is a problem in that fluctuation of optical wavelength due to laser diode driving current variation cannot be compensated. Further, in the control mode where the optical wavelength value of the laser output is monitored to control the temperature of the laser element, the wavelength monitor may become unstable depending on external conditions, and there is a risk that the laser may be damaged or suffer deterioration.

It is therefore a first object of this invention to provide a control apparatus and method for stabilizing optical wavelength which can stabilize an optical output wavelength to high precision over a long period of time regardless of external conditions under which the laser element is controlled and operated.

It is a second object of this invention to provide an optical wavelength division multiplexer which can avoid interference between wavelengths of optical signal channels regardless of external conditions.

To achieve the above objects, the control apparatus for stabilizing optical wavelength of a laser output light according to the present invention comprises a plurality of control circuits for outputting control signals, in respectively different control modes, to control laser element operation, and a selecting means for selecting one of said control circuits according to external conditions of the laser element and applying a control signal output from the selected control circuit, thereby to perform stabilizing control of optical wavelength in the selected mode.

More specifically, to achieve the first object, the control apparatus for stabilizing optical wavelength of light output by a laser according to the present invention comprises: a deviation detecting means for detecting a first control deviation of one of a plurality of parameters which may cause a wavelength variation of laser output light from a predetermined control target value, an optical wavelength deviation detecting means for detecting a second control deviation of the wavelength of laser output light from a predetermined target value, a selecting means for selecting one of the first and second control deviations, and a control means for controlling one of the parameters such that the selected control deviation is reduced.

According to the present invention, the control apparatus for stabilizing optical wavelength of light output from a laser module having a laser, temperature sensor and cooling/heating element, comprises a first control means for stabilizing the optical wavelength, a second control means for stabilizing the optical wavelength, a selecting means for selecting either of the first and second control means according to external conditions, wherein the first control means comprises a temperature monitor for monitoring laser temperature by the temperature sensor, a first comparator for detecting a difference between a laser temperature value output by the temperature monitor and a control target value, and a first current control means for determining a current value passed through the cooling/heating element so that the difference detected by the aforesaid comparator becomes 0, and the second wavelength stabilizing control means comprises an optical coupler for splitting part of the output light from the laser module, an optical wavelength monitor for monitoring the wavelength of the light split by the optical coupler, a second comparator for detecting a difference between the value of the monitored optical wavelength and a control target value, and a second current control means for determining a current value passed through the cooling/heating element so that the detected difference from the target value becomes 0.

To achieve the second object, the optical wavelength division multiplexer for transmitting plural lights of different wavelength according to this invention comprises a plurality of laser diodes installed on a common heat sink, a temperature controller for controlling the temperature of the heat sink to a predetermined temperature, an optical sensor for detecting respective oscillation wavelengths of the aforesaid laser diodes, driving current sources for driving the laser diodes, a current controller for controlling the driving currents respectively output by the driving current sources such that the oscillation wavelengths of the laser diodes approach target wavelengths corresponding to each of the laser diodes, wherein the current controller controls the driving current of one of the plural laser diodes so that it approaches a predetermined target current if the optical output of that laser diode shuts down, or if a predetermined time has not yet elapsed since optical output from that laser diode started.

The optical wavelength division multiplexer for transmitting plural lights of different wavelength according to this invention comprises a plurality of laser diodes, a plurality of driving current sources for respectively driving the laser diodes, a plurality of optical sensors for respectively detecting the oscillation wavelengths of the laser diodes, a plurality of temperature sensors for respectively detecting the temperatures of the laser diodes, and a temperature controller for controlling the temperature of a laser diode so that the detected oscillation wavelength approaches the target wavelength corresponding to that laser diode when the oscillation wavelength of that laser diode is detected to be stable, and controls the temperature of that laser diode to a predetermined temperature for each laser diode when the oscillation wavelength of that laser diode is not detected to be stable.

According to this invention, output light having a stabilized optical wavelength is obtained by selecting an optimum control mode suited to different conditions including short-term wavelength fluctuations occurring when a stop signal for the output light is supplied, when there is a loss of signal due to a detection circuit fault or when the source voltage is switched on, and a long-term wavelength fluctuation due to driving current increase when the laser deteriorates over time.

If the selectable control modes include a laser element constant temperature control mode and a wavelength monitoring control mode, wavelength can be stabilized with high precision in the short-term by selecting the laser element constant temperature control mode. In this case, as control is performed regardless of the laser output light, it is effective when power is switched on, when a stop signal is input or when there is a loss of signal in the transmission path after the coupler. On the other hand, by selecting the wavelength monitoring control mode, control operations are carried out depend on the wavelength fluctuation of the output light. Therefore, both wavelength fluctuations due to temperature variation of the laser element and wavelength fluctuations due to laser diode forward current variations are suppressed, and high precision optical wavelength stabilization is achieved in the long-term.

If the source controller is shared, there is no need to provide a special driving controller for each control mode, and the scale of the circuitry can be reduced. Also, if a delay means is provided to adjust the control mode change-over timing, the control which is realized can be adapted to the response speed of each control mode, and the response speed of the cooling/heating element.

According to the present invention, by arranging at least part of the optical wavelength control functions in the optical transmission system, the optical transmitter can be made more compact. Also, if plural laser devices are provided comprising optical wavelength stabilizing control functions according to the present invention, a wavelength division multiplexer can be obtained which avoids interference between laser wavelengths in adjacent channels in all cases regardless of external conditions.

DETAILED DESCRIPTION OF THE PREFERRED EMBODIMENTS

Figure 1:
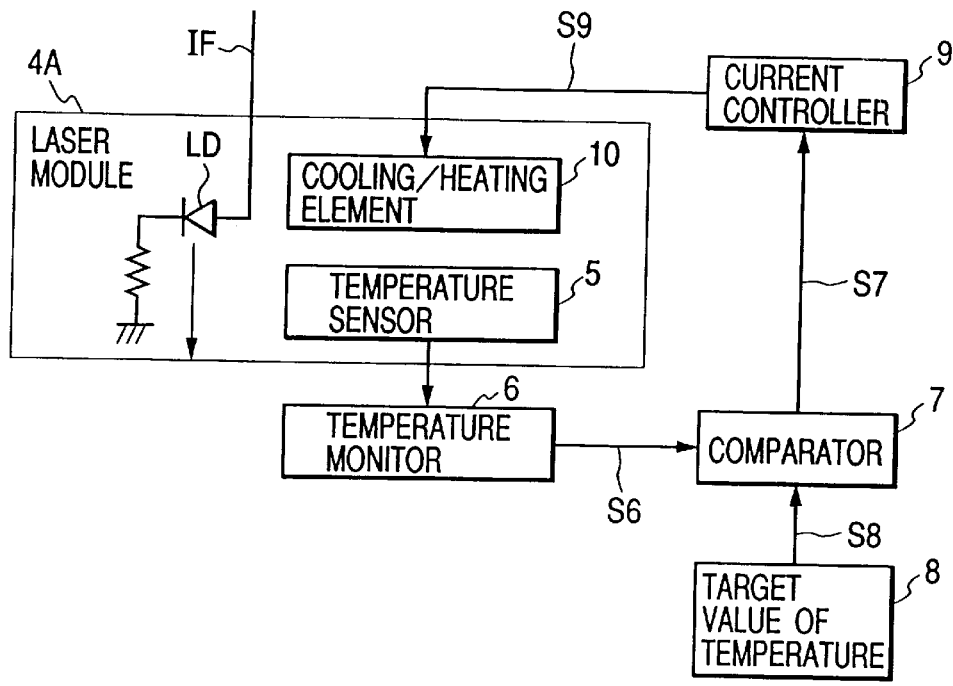
FIG. 1 is a block diagram showing a prior art control apparatus for stabilizing optical wavelength using a laser constant temperature control mode.
Figure 2:
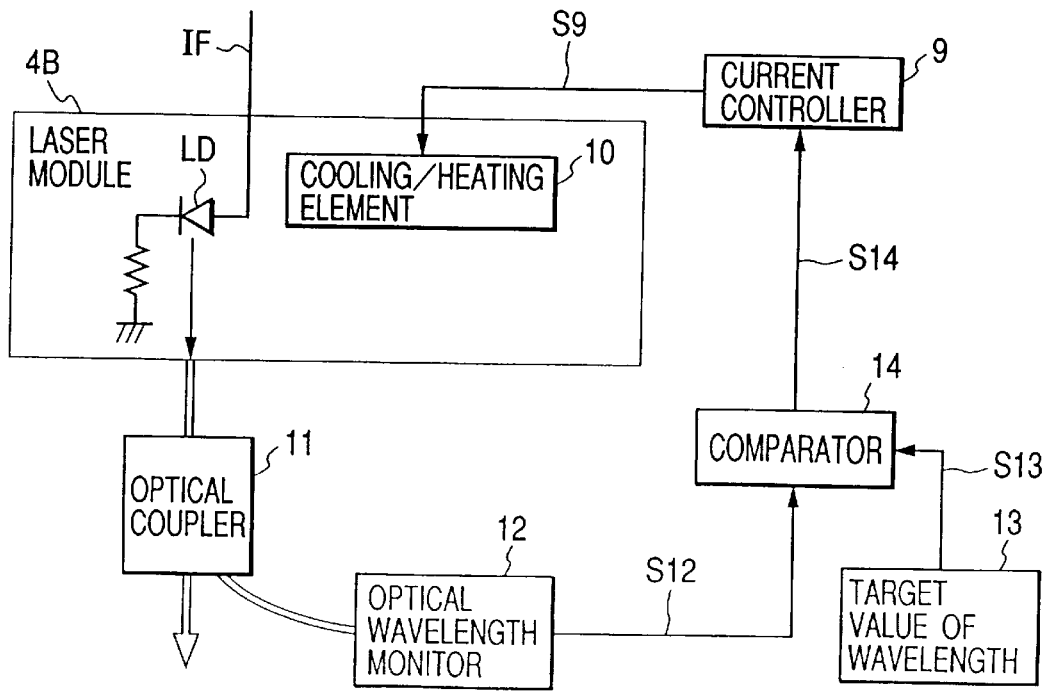
FIG. 2 is a block diagram showing a prior art control apparatus for stabilizing optical wavelength in a wavelength monitoring control mode.
Figure 3:
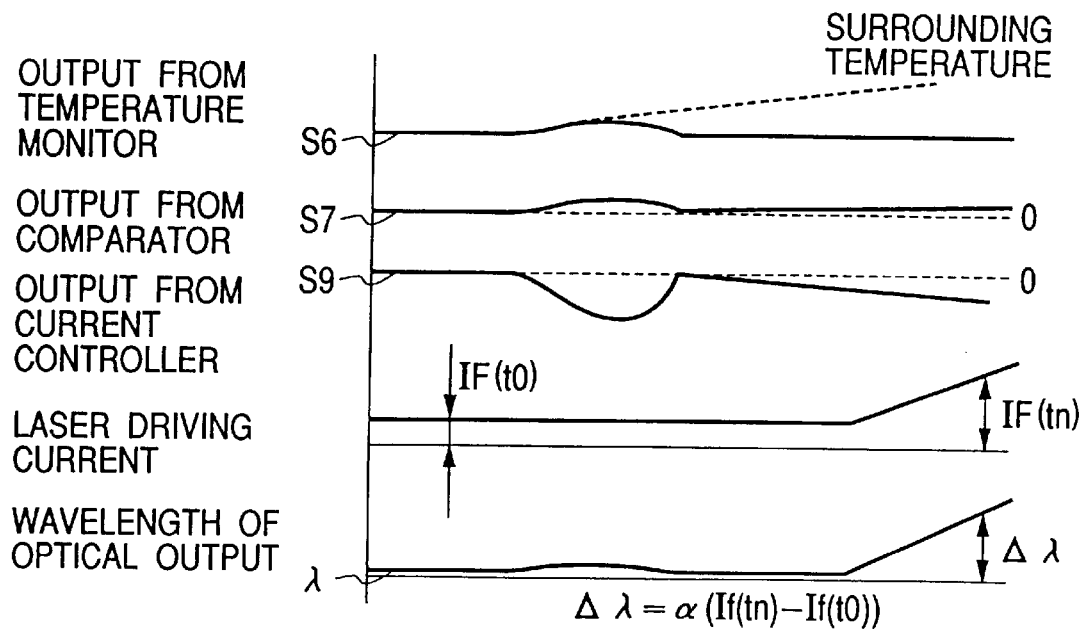
FIG. 3 is a waveform diagram showing a relation between principal control signals and output optical wavelengths in the prior art control apparatus for stabilizing optical wavelength shown in FIG. 1.
Figure 4:
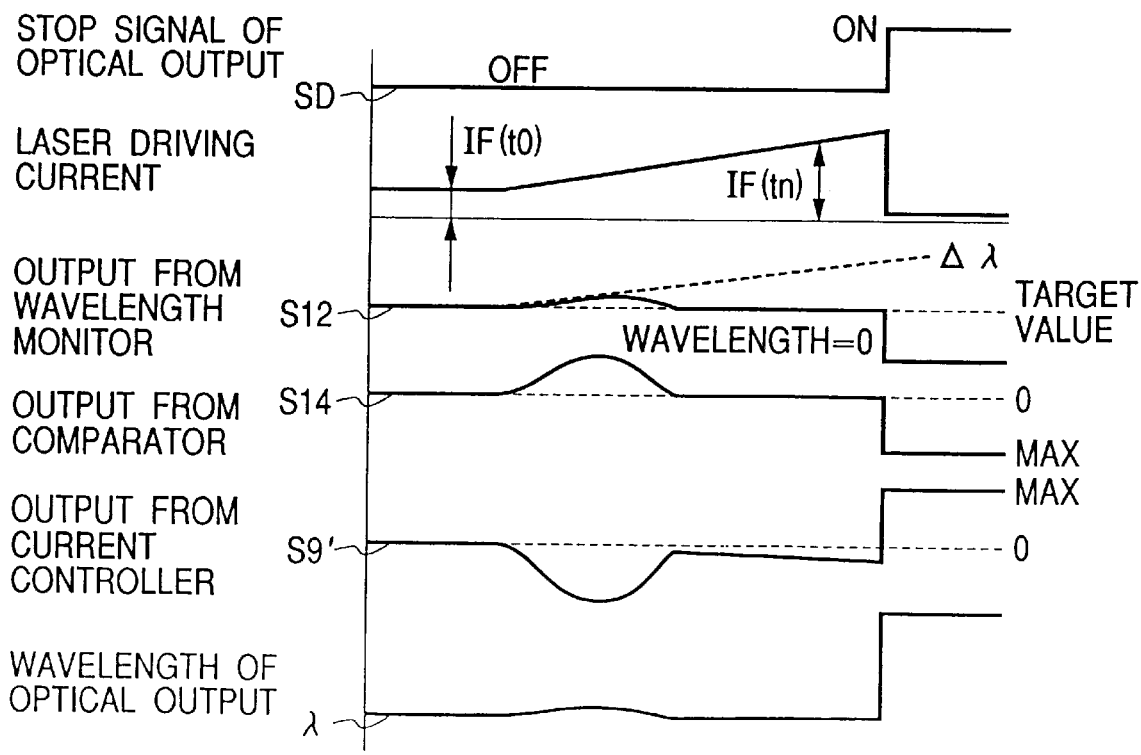
FIG. 4 is a waveform diagram showing a relation between principal control signals and output optical wavelengths in the prior art control apparatus for stabilizing optical wavelength shown in FIG. 2.

This invention will now be described in detail referring to the drawings.

First, a first embodiment of the invention will be described referring to FIGS. 5 and 6. According to this embodiment, two optical wavelength control circuits are provided with two different control modes, and a function is provided to select one of these modes according to external conditions.

Figure 5:
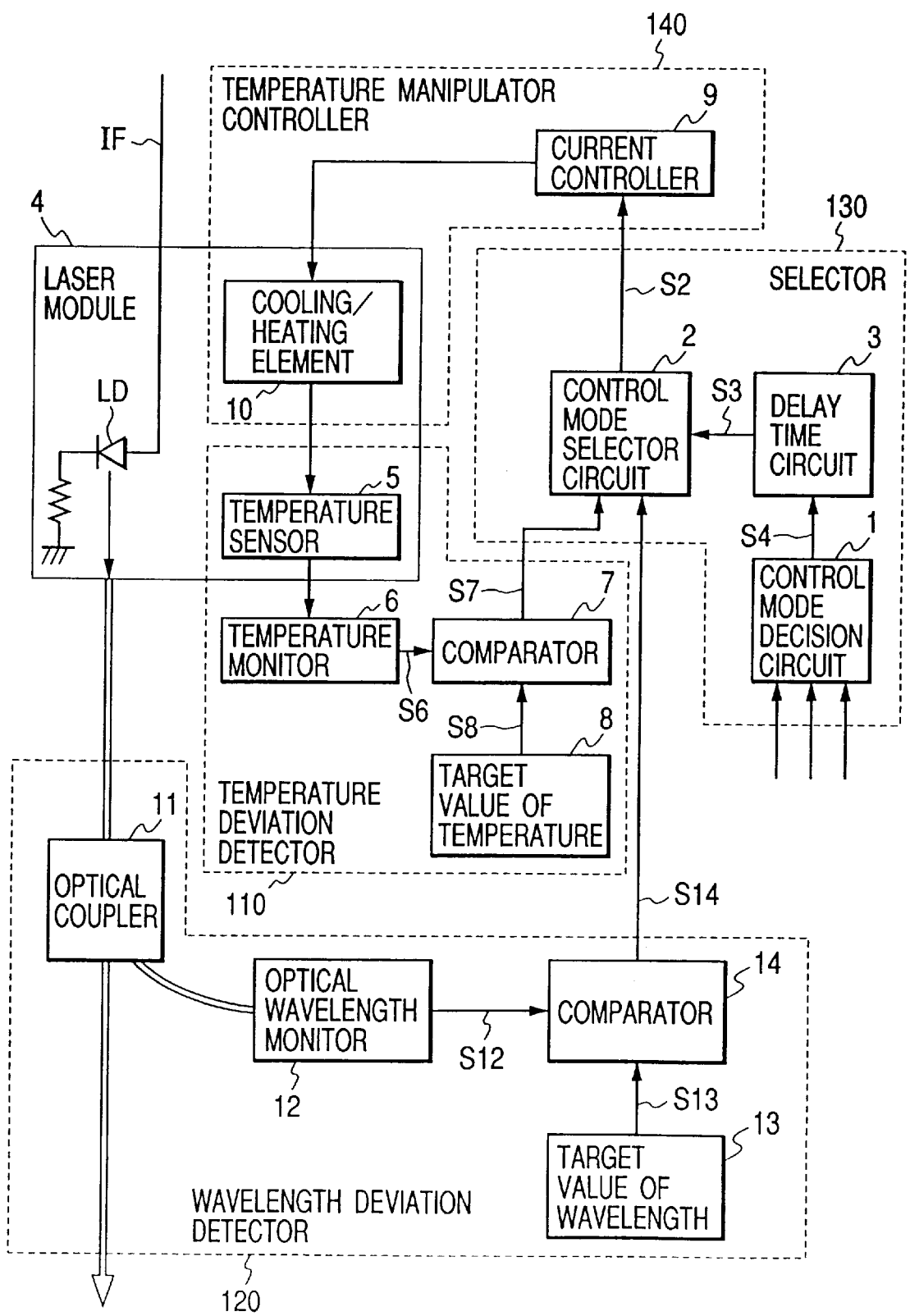
FIG. 5 is a block diagram showing a first embodiment of the control apparatus for stabilizing optical wavelength according to the present invention.

The control apparatus for stabilizing optical wavelength shown in FIG. 5 comprises a temperature deviation detector 110 for detecting a deviation of laser temperature from a control target value, a wavelength deviation detector 120 for detecting a deviation of optical wavelength output by the laser from a control target value, a selector 130 for determining the control mode to be performed according to external conditions, and selecting the appropriate deviation detector for the determined control mode from either the temperature deviation detector 110 or the wavelength deviation detector 120, and a temperature manipulator controller 140 for controlling the laser temperature according to a deviation signal S2 output from the deviation detector selected by the aforesaid selector 130.

The temperature deviation detector 110 detects a deviation of the laser element temperature from a predetermined target value of laser temperature, and outputs this as a deviation signal S7. The deviation signal S7 is used in the control mode wherein the laser element temperature is maintained constant. The temperature deviation detector 110 comprises a temperature sensor 5 installed together with a laser diode LD in a laser module 4, a temperature monitor 6 which monitors the temperature of the laser diode using the temperature sensor 5, a target value setting circuit 8 which sets a target value of temperature to which the temperature of the laser diode should be controlled, and a comparator 7 which compares the temperature value S6 monitored by the temperature monitor 6 with the target value S8 set by the target value setting circuit 8, and outputs the result as the deviation signal S7.

The wavelength deviation detector 120 detects a difference of a wavelength S12 of the laser output light from a predetermined wavelength target value S13, and outputs this as a deviation signal S14. This deviation signal S14 is used in the wavelength monitoring control mode for stabilizing optical wavelength wherein the optical wavelength λ of the light output from the laser is monitored. The wavelength deviation detector 120 comprises an optical coupler 11 which splits part of the light output from the laser diode LD in the laser module 4, an optical wavelength monitor 12 which receives the split light and monitors its wavelength λ, a target value setting circuit 13 which sets a target value S13 of wavelength, and a comparator 14 which compares the value S12 of optical wavelength monitored by the optical wavelength monitor 12 with the target value S13 set by the target value setting circuit 13. As the optical wavelength monitor 12, a wavelength meter or a wavelength locker comprising a band pass filter may for example be used.

The selector 130 determines the control mode according to the external conditions of the laser, selects the deviation signal S4 or S14 depending on the determined control mode, and supplies the selected deviation signal to the temperature manipulator controller 140. The selector 130 comprises a control mode decision circuit 1 which reads plural state signals representing the external conditions and determines the control mode to be applied based on the external conditions, a delay time circuit 3 which supplies a control mode signal S4 output by the control mode decision circuit to a control mode selector circuit 2 leaving a predetermined delay time taking account of a response time characteristic of the control mode and a response time of temperature control, and the control mode selector circuit 2 which selectively supplies either the deviation signal S7 or S14 to the temperature manipulator controller 140 according to a control mode signal S3 output by the delay time circuit 3.

The delay time circuit 3 may for example comprise a low pass filter or the like, and the control mode selector circuit 2 may for example comprise an analog switch or the like. The functions of the control mode decision circuit 1 and the delay time circuit 3 may be combined and implemented by a microcomputer.

The temperature manipulator controller 140 controls the laser diode temperature depending on the control mode selected by the selector 130. It comprises a cooling/heating element 10 installed on a substrate together with the laser diode LD in the laser module 4, and a current controller 9 for controlling the current supplied to the cooling/heating element 10 according to the deviation signal selected by the selector 130.

Next, the operation of this control apparatus for stabilizing optical wavelength according to the embodiment will be described.

First, operation in the constant laser temperature control mode, which is one of the two available control modes, will be described. In this control mode, the laser temperature is monitored by the temperature monitor 6 using the temperature sensor 5 installed in the laser module 4. The difference between the output value S6 from the temperature monitor 6 and the control target value S8 is detected by the comparator 7. The current controller 9, by controlling the current value supplied to the cooling/heating element 10 in the laser module 4, maintains the temperature of the laser element LD constant such that this difference (signal S7) approaches 0. Therefore in this control mode, in the short-term, high precision wavelength stabilization is achieved. As the laser element temperature can be monitored regardless of the laser output light, control is stable even when power is switched on, when a shut-down signal is input, or when there is a loss of signal.

Next, operation in the wavelength monitoring control mode will be described.

In this control mode, part of the output light from the laser module 4 is split by the coupler 11, the wavelength of the split output light is monitored by the optical wavelength monitor 12, and the difference between the value of the monitored light output wavelength and the control target value 13 is detected by the comparator 14. The optical wavelength of the output of the laser is stabilized by the current controller 9, which controls the current value supplied to the cooling/heating element 10 in the laser module 4 so that the deviation signal S14 output by the comparator 14 becomes 0. In this control mode, as the wavelength is monitored to control temperature, optical wavelength variations due not only to laser element temperature fluctuations but also to laser diode driving current fluctuations can be suppressed, and therefore, the optical wavelength can be stabilized to a high precision over a long period of time. However in such a case that, for example, power is switched on, a shut-down signal is input, or there is a loss of signal after the coupler, as the monitoring of the optical wavelength is difficult, there is a possibility of faulty operation.

In the control apparatus for stabilizing optical wavelength according to the embodiment, when power is switched on, when a shut-down signal is input or when there is a loss of signal in the optical signal path after the coupler, the constant laser temperature control mode is applied, and in all other cases, the wavelength monitoring control mode is applied. Hence, optical wavelength can be stabilized to high precision under any external conditions.

Next, the control mode selection operation performed by the selector 130 will be described referring to FIGS. 5 and 6.

In the high precision control apparatus for stabilizing optical wavelength according to the invention, the control mode decision circuit 1 reads parameters representing external conditions, and sets the output signal S4 to High or Low level according to these conditions. After signals already received have been output for a certain time, the delay time circuit 3 outputs the High/Low level signal S4 to the selector circuit 2. In this way, the control mode is changed over to suit the response time of each control mode or the response time of the cooling/heating element 10. When, for example, the input signal S4 is Low level, the control mode selector circuit 2 selects the differential signal S7 which is suitable for short-term wavelength fluctuations, and which is effective when power is switched on, when a stop signal is supplied, or when there is a loss of signal due to an obstacle in the transmission path. Conversely, when the input signal S4 is High level, the control mode selector circuit 2 selects the differential signal S14 of the wavelength monitoring control mode which is suitable for long-term wavelength stabilization, and which is effective for wavelength fluctuations due to deterioration of the laser over time.

As parameters representing external conditions read by the control mode decision circuit 1, the state of the power supply (source voltage Vs), the presence or absence of a stop signal SD or of the state of the optical output OPT may for example be used. The source voltage Vs and stop signal SD are led to the control mode decision circuit 1 via a signal line which respectively combines these signal sources. The optical output OPT can be detected using the output S12 of the optical wavelength monitor 12.

When the states of these parameters are displayed by logical symbols as shown below, the output of the control mode decision circuit 1 may be expressed by the logical equation (2).

$$\text{Control mode decision circuit output} = SD + \overline{fheight Vs} + \overline{OPT} \quad (2)$$

Here, Vs=1:source voltage ON, Vs=0:source voltage OFF, SD=1:stop signal ON, SD=0:stop signal OFF, OPT=1:optical output is normal, OPT=0:loss of signal.

Figure 6:
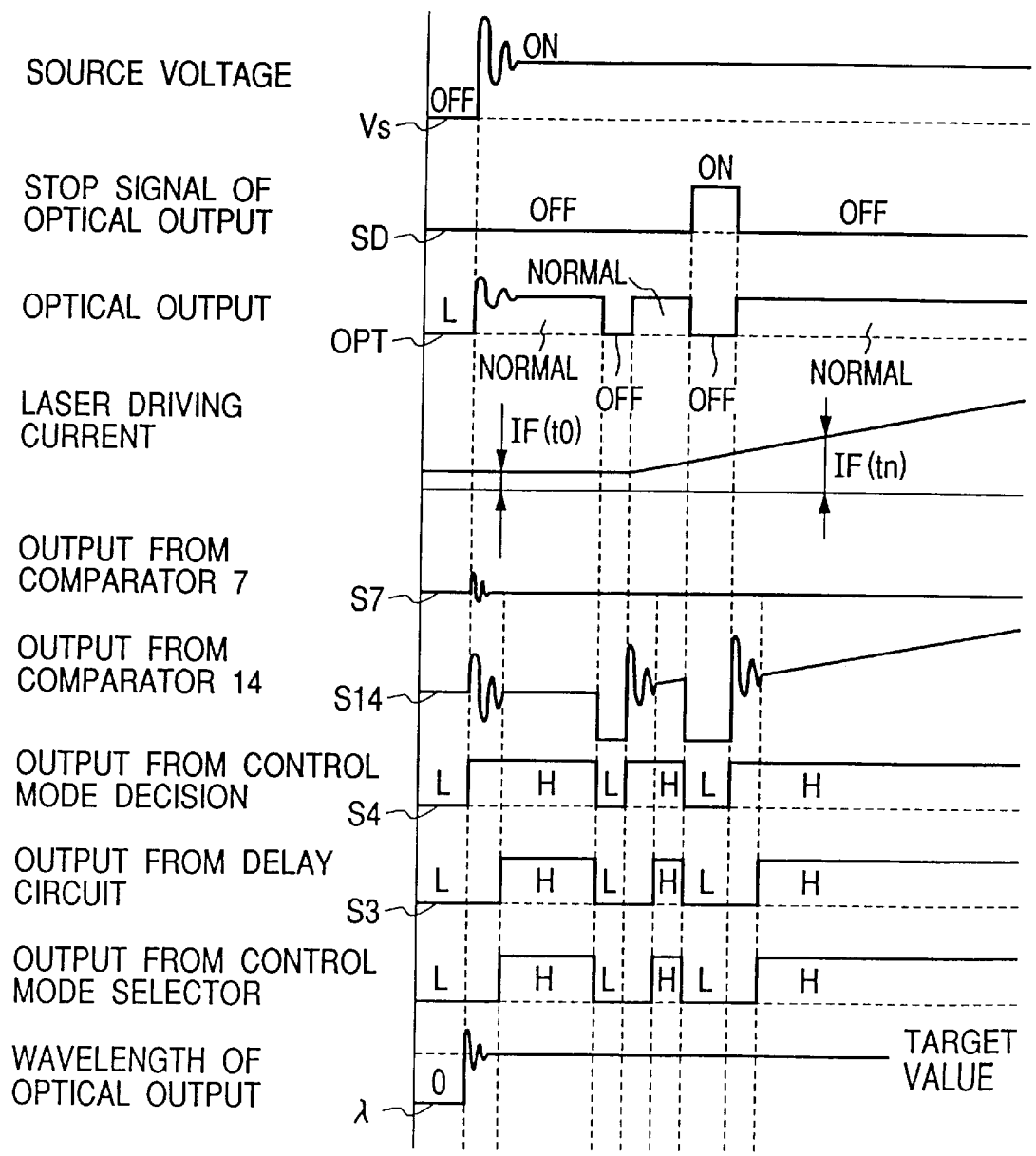
FIG. 6 is a waveform diagram showing a relation between principal control signals and output optical wavelengths in the control apparatus for stabilizing optical wavelength according to the present invention shown in FIG. 5.

FIG. 6 shows the variation of the external condition parameters Vs, SD, OPT, laser diode driving current IF, differential signal S7 of the constant temperature control mode, differential signal S14 of the wavelength monitoring control mode, mode signal S4 output from the control mode decision circuit 1, mode signal S3 output from the delay time circuit 3, control mode selection signal in the control mode selector circuit 2, and the wavelength lambda of the laser output light, taking the elapsed time as the horizontal axis.

For example, when the stop signal is ON, the output of the control mode decision circuit 1 is Low level from the equation (2), and the control mode selector circuit 2 selects the laser element constant temperature control mode which stabilizes the wavelength even when a stop signal is ON.

For long-term stabilization control, the source voltage is ON, the stop signal is OFF, and the optical output is normal. Therefore the output signal S4 of the control mode decision circuit 4 is High level from the equation (2), and the control mode selector circuit 2 selects the wavelength monitoring control mode which can stabilize wavelength in the long-term, and which can compensate wavelength fluctuations due to deterioration of the laser over time.

According to the present invention, as the optimum control mode is automatically selected as per equation (2) even when power is switched on or there is a loss of signal, the optical output wavelength can be stabilized with high precision to suit external conditions. When the laser element constant temperature control mode is selected, as high precision wavelength stabilization can be achieved in the short-term, and as the temperature control signal is unaffected by the laser output light, abnormal operation of the control circuit can be avoided when there is a large variation of laser output light due to factors other than temperature variation, such as for example when power is switched on, when a stop signal is supplied, or when there is a loss of signal due to an obstacle in the laser light detection system comprising the optical coupler 11. On the other hand, when the wavelength monitoring control mode is selected, the wavelength is monitored, so wavelength variations due not only to laser element temperature variations but also to laser diode driving current variations can be stabilized with high precision in the long-term.

Further, according to this embodiment, as the current controller 9 is shared between the two control modes, there is no need to provide a special current driving unit for each control mode, and therefore, the circuitry can be made compact.

As the change-over timing of control modes is adjusted by the delay time circuit 3, the control mode can be changed over to suit the response speed of each control mode and the response characteristics of the cooling/heating element 10. Therefore, if each of these control modes has an optical wavelength stabilizing controller, plural optical transmitters having mutually different output wavelengths are provided and the outputs of these transmitters are combined into one by, for example, an optical coupler, a stable optical wavelength division multiplexer can be obtained with no inter-channel interference due to wavelength variation.

Next, a second embodiment of this invention will be described referring to FIG. 7.

This embodiment differs from the first embodiment in that a constant forward current control mode is provided as one control mode instead of constant temperature control.

Figure 7:
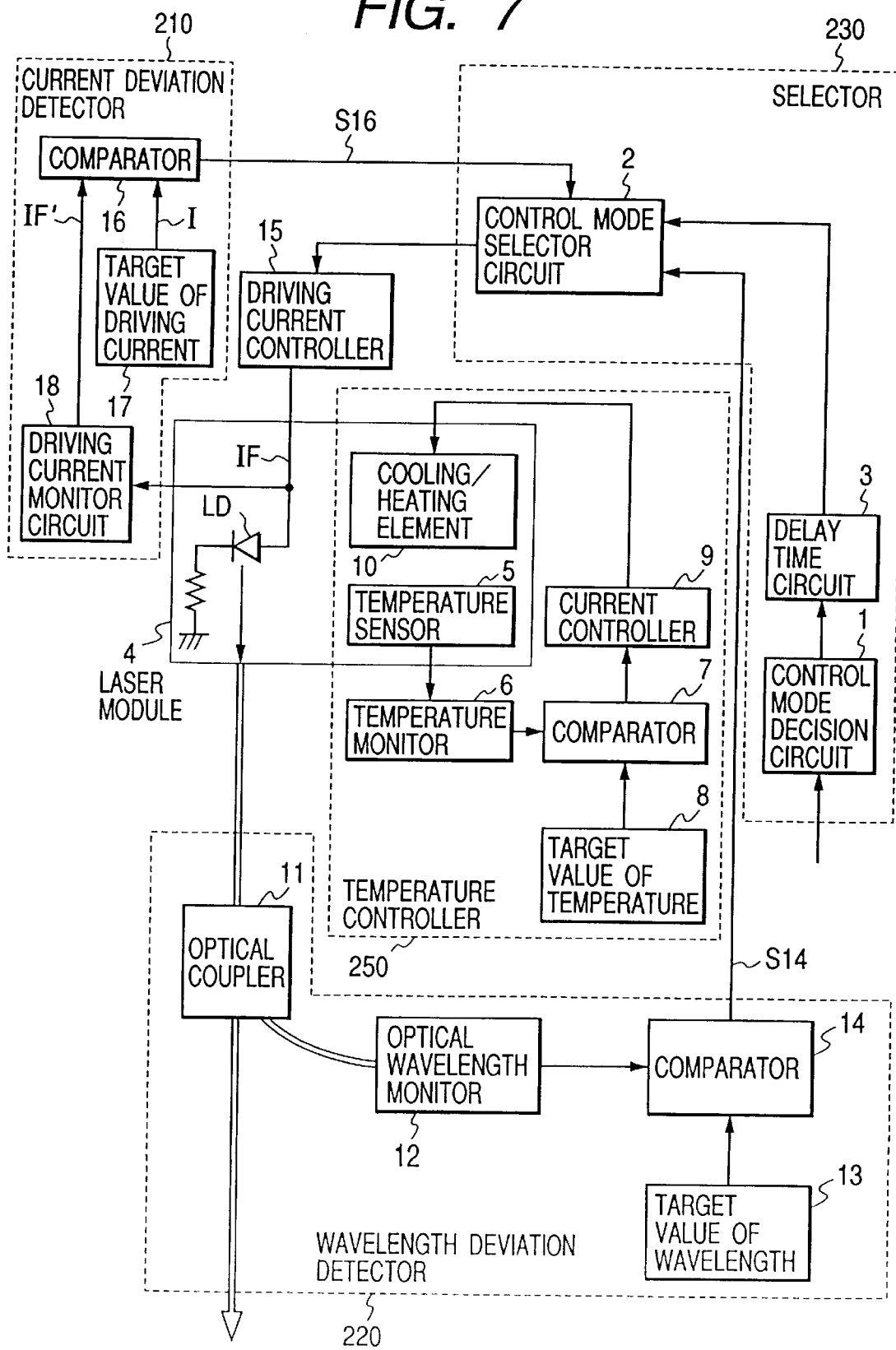
FIG. 7 is a block diagram of another embodiment of the control apparatus for stabilizing optical wavelength according to the present invention.

The control apparatus for stabilizing optical wavelength shown in FIG. 7 comprises a current deviation detector 210 which detects a deviation of laser diode driving current IF from a control target value and outputs the detected deviation as a deviation signal S16, a wavelength deviation detector 220 which detects a deviation of laser output light wavelength from a control target value and outputs the detected deviation as a deviation signal S14, a selector 230 which determines the control mode according to external conditions and selects either the deviation signal S16 from the current deviation detector 210 or the deviation signal S14 from the wavelength deviation detector 220, and a driving current controller 15 which controls the laser diode driving current IF according to the deviation signal selected by the selector 230.

The current deviation detector 210 has a function of detecting a deviation of laser diode driving current from a predetermined control target value of laser diode forward current, and this current deviation is used for the control mode wherein the laser diode forward current is maintained constant. The current deviation detector 210 comprises a driving current monitor 18 for monitoring the driving current IF of the laser diode LD, a target value setting circuit 17 for setting a control target value I of laser diode driving current, and a comparator 16 for comparing a value If of driving current monitored by the driving current monitor 18 with the target value I set by the target value setting circuit 17, and outputting a signal S16 showing the current deviation.

The wavelength deviation detector 220 detects a deviation of the wavelength of the light output by the laser from a predetermined wavelength control target value, and this wavelength deviation is used in the wavelength monitoring control mode. The wavelength deviation detector 220 has an identical construction to that of the wavelength deviation detector 120 in the first embodiment described in FIG. 5, and its description will therefore be omitted here.

The selector 230 determines the control mode according to the external conditions of the laser, selects a deviation according to this control mode, and supplies this to the driving current controller 15. The selector 230 has an identical construction to that of the selector 130 in the first embodiment, and its description will therefore be omitted here.

The driving current controller 15 controls the driving current IF for driving the laser diode LD depending on the control mode selected by the selector 130.

Next, the operation of the optical wavelength stabilizing controller according to this embodiment will be described.

First, operation in the constant laser diode driving current control mode, which is one of the two available control modes, will be described. In this control mode, the driving current IF of the laser diode LD is monitored by the driving current monitor 18. A difference between the output value IF' from the driving current monitor 18 and the control target value I of driving current is detected by the detector 16, and the current deviation signal S16 is output. In the driving current controller 15, the driving current value for driving the laser element LD is controlled so that the difference between the present driving current shown by the deviation signal S16 and the target value approaches 0. In this way, the laser diode driving current IF is maintained constant so as to coincide with the target value I, and short-term, high precision optical wavelength stabilization is achieved. The laser diode driving current is monitored regardless of variations of laser output light, so control is stable even when power is switched on, when a stop signal is supplied, or when there is a loss of signal due to an obstacle in the optical signal path after the coupler.

The operation in the wavelength monitoring control mode which is the other control mode of this embodiment is identical to that of the first embodiment, and its description will therefore be omitted.

In the control apparatus for stabilizing optical wavelength according to this embodiment, the constant laser diode driving current control mode is applied during periods when there is a large fluctuation of laser output light, such as when power is switched on or when a stop signal is supplied, and the wavelength monitoring control mode is applied at other times, hence the optical wavelength can be stabilized with high precision under any external conditions.

In addition to the aforesaid two selectable wavelength stabilizing control modes, the control apparatus for stabilizing optical wavelength shown in FIG. 7 further comprises a temperature controller 250 for maintaining the laser temperature constant. By controlling the laser to constant temperature and performing laser diode driving current control avoiding optical wavelength fluctuations due to laser temperature, the optical wavelength can be stabilized with high precision.

According to this embodiment, when the constant driving current control mode is selected, short-term optical wavelength stabilization is achieved, and as the control signal is unrelated to the laser output light, this is effective when power is switched on, when a stop signal is supplied, or when there is an obstacle in the optical detection path. Further, when the wavelength monitoring control mode is selected, the laser output is monitored, so wavelength fluctuations due to laser element temperature variations or laser diode driving current variations are suppressed, and high precision wavelength stabilization is achieved in the long-term.

By providing a plurality of optical transmitters having the optical wavelength stabilizing control functions shown in FIG. 7, an optical wavelength division multiplexer which avoids inter-wavelength interference between adjacent channels may be constructed. In this case, a plurality of lasers can be installed on a common heat sink substrate, and if a common temperature controller 250 is used, the optical wavelength multiplexing transmitter can be made more compact overall. Moreover, even if heat flow blocks between heat sinks are omitted, the optical wavelength can be stabilized with high precision.

In implementing this invention, when the optical transmitter comprising the laser module 4 is combined with an optical signal transmission system comprising an optical fiber, part of the component elements of the control apparatus for stabilizing optical wavelength, for example the optical wavelength detector 120 and part of the mode selector 130, may be installed on the side of the optical signal transmission system, and the remaining component elements may be installed on the side of the optical transmitter. The control apparatus and method according to this invention are also applicable to a modulator integrated type of laser module which includes integrated modulators for modulating light signals output from the laser diodes.

What is claimed:

1. A control apparatus for stabilizing the wavelength of light output from a laser element, comprising:
   a plurality of control circuits for outputting control signals to control the optical wavelength of said laser element in respectively different control modes, and
   selecting means for selecting one of said control circuits according to the external conditions of said laser element, and applying a control signal output from said selected control circuit to said laser element, thereby achieving stabilizing control of optical wavelength in said selected control mode.

2. A control apparatus for stabilizing the wavelength of light output from a laser, comprising:
   parameter deviation detecting means for detecting a first control deviation of one parameter responsible for causing variations of optical wavelength output from the laser from a predetermined target value,
   optical wavelength deviation detecting means for detecting a second control deviation of optical wavelength output from the laser from a predetermined target value,
   selecting means for selecting either of said first and second control deviations, and
   manipulating means for manipulating one of said parameters so that said selected control deviation is reduced.

3. A control apparatus for stabilizing optical wavelength according to claim 2, wherein one of said parameters is laser temperature.

4. A control apparatus for stabilizing optical wavelength according to claim 2, wherein one of said parameters is driving current which drives the laser.

5. A control apparatus for stabilizing optical wavelength according to claim 2, wherein, when said second control deviation is stably detected by said optical wavelength deviation detecting means, said selecting means selects said first control deviation, and when said second control deviation is not stably detected, said selecting means selects said second control deviation.

6. A control apparatus for stabilizing the wavelength of light output from a laser module including a laser element, a temperature sensor and a cooling/heating element, comprising:
   first control means for stabilizing said optical wavelength,
   second control means for stabilizing said optical wavelength, and
   selecting means for selecting either of said first and second control means according to external conditions, and performing stabilizing control of the optical wavelength of said laser element according to an output signal from the selected control means, wherein:
   said first control means comprises a temperature monitor for monitoring the temperature of the laser detected by said temperature sensor, a first comparator for detecting a difference between the output value of the temperature monitor and a laser temperature control target value, and first current control means for controlling the current flowing in said cooling/heating element according to an output signal from said first comparator, and
   said second control means comprises an optical coupler for splitting the output light from the laser module, an optical wavelength monitor for monitoring the wavelength of the split output light, a second comparator for detecting a difference between the monitored optical output wavelength value and a wavelength control target value, and second current control means for controlling the current flowing in said cooling/heating element according to an output signal from said second comparator.

7. A control apparatus for stabilizing optical wavelength according to claim 6, wherein:
   said first and second current control means comprise a common current controller connected to said first and second comparators.

8. A control apparatus for stabilizing optical wavelength according to claim 6, further comprising:

delay means for delaying current control of said cooling/heating element based on said selected control means by a predetermined time when either of said first and second control means is selected.

9. A control apparatus for stabilizing optical wavelength according to claim 6, wherein:

said laser module is installed in an optical transmitter, at least part of said first and second control means and said selecting means is installed in said optical transmitter, and the remaining part is installed in the optical transmitting system for transmitting output light from said laser module.

10. An optical wavelength division multiplexer for transmitting a plurality of light signals having different wavelengths to each other, comprising:

a plurality of laser diodes installed on a common heat sink, a temperature controller for controlling the temperature of said heat sink to a predetermined temperature, an optical sensor for detecting oscillation wavelengths of said laser diodes, a driving current source for driving said laser diodes, and a current controller for controlling the currents with which said driving current source drives said laser diodes such that the detected oscillation wavelengths of said laser diodes approach predetermined target wavelengths for each laser diode, wherein said current controller controls the driving current of one of said plural laser diodes so that it approaches a predetermined target current when the output light from said laser diode has shut down, and a predetermined time from starting optical output has not elapsed.

11. An optical wavelength division multiplexer for transmitting a plurality of light signals having different wavelengths to each other, comprising:

a plurality of laser diodes, a driving current source for driving said laser diodes, an optical sensor for detecting oscillation wavelengths of said laser diodes, a temperature sensor for detecting temperatures of said laser diodes, and a temperature controller for controlling the temperature of each of said laser diodes so that a detected oscillation wavelength approaches a predetermined target wavelength for the laser diode when the oscillation wavelength of the laser diode is stably detected, and for controlling the temperature of each of said laser diode to a predetermined temperature for each laser diode when the oscillation wavelength of said laser diode is not stably detected.

12. A control method for stabilizing the wavelength of light output from a laser element, comprising the steps of:

selecting one of a plurality of control circuits for outputting control signals for controlling the optical wavelength of said laser element in respectively different control modes according to the external conditions of said laser element, and applying a control signal output from said selected control circuit to said laser element, thereby achieving stabilizing control of optical wavelength in said selected control mode.

13. A control method for stabilizing the wavelength of light output by a laser, comprising:

detecting a first control deviation of one parameter responsible for causing variations of optical wavelength output from the laser from a predetermined target value, detecting a second control deviation of optical wavelength output from the laser from a predetermined target value, selecting either of said first and second control deviations, and manipulating one of said parameters so that said selected control deviation is reduced.

14. A method for stabilizing optical wavelength according to claim 13, wherein one of said parameters is laser temperature.

15. A method for stabilizing optical wavelength according to claim 13, wherein one of said parameters is driving current for driving said laser.

16. A method for stabilizing optical wavelength according to claim 13, wherein in said selecting step, when said second control deviation is stably detected in said optical wavelength deviation detecting step, said first control deviation is selected, and when said second control deviation is not stably detected in said optical wavelength deviation detecting step, said second control deviation is selected.

* * * * *